(12) United States Patent
Gilchrist et al.

(10) Patent No.: US 10,556,351 B2
(45) Date of Patent: Feb. 11, 2020

(54) TRANSPORT APPARATUS

(71) Applicant: Brooks Automation, Inc., Chelmsford, MA (US)

(72) Inventors: Ulysses Gilchrist, Reading, MA (US); Jairo Terra Moura, Marlborough, MA (US)

(73) Assignee: BROOKS AUTOMATION, INC., Chelmsford, MA (US)

(*) Notice: Subject to any disclaimer, the term of this patent is extended or adjusted under 35 U.S.C. 154(b) by 0 days.

(21) Appl. No.: 16/201,539

(22) Filed: Nov. 27, 2018

(65) Prior Publication Data

US 2019/0160690 A1 May 30, 2019

Related U.S. Application Data

(63) Continuation of application No. 14/365,277, filed as application No. PCT/US2012/070095 on Dec. 17, 2012, now Pat. No. 10,137,576.

(60) Provisional application No. 61/576,450, filed on Dec. 16, 2011.

(51) Int. Cl.
| | |
|---|---|
| *B25J 15/00* | (2006.01) |
| *H01L 21/687* | (2006.01) |
| *H01L 21/677* | (2006.01) |
| *B25J 18/00* | (2006.01) |

(52) U.S. Cl.
CPC .............. *B25J 15/00* (2013.01); *B25J 18/00* (2013.01); *H01L 21/67742* (2013.01); *H01L 21/67766* (2013.01); *H01L 21/6875* (2013.01); *H01L 21/68707* (2013.01); *H01L 21/68757* (2013.01); *Y10S 901/30* (2013.01)

(58) Field of Classification Search
CPC .................................. B25J 15/00; B25J 18/00
USPC .................................. 294/213, 902; 414/941
See application file for complete search history.

(56) References Cited

U.S. PATENT DOCUMENTS

| | | |
|---|---|---|
| 6,379,095 B1 | 4/2002 | Elliott et al. |
| 6,409,452 B1 | 6/2002 | Brodine et al. |
| 9,406,539 B2 | 8/2016 | Hiroki |
| 2004/0113444 A1 | 6/2004 | Blonigan et al. |
| 2005/0105991 A1 | 5/2005 | Hofmeister et al. |
| 2005/0110291 A1 | 5/2005 | Klein et al. |
| 2006/0131903 A1 | 6/2006 | Bonora et al. |
| 2008/0025822 A1 | 1/2008 | Kim et al. |
| 2009/0065995 A1 | 3/2009 | Serrano |

(Continued)

FOREIGN PATENT DOCUMENTS

| | | |
|---|---|---|
| CN | 1726589 | 1/2006 |
| CN | 101678970 | 3/2010 |
| JP | 4824816 | 11/2011 |

(Continued)

OTHER PUBLICATIONS

International Search Report, International Application No. PCT/US2012/070095, dated Feb. 26, 2013.

*Primary Examiner* — Ronald P Jarrett
(74) *Attorney, Agent, or Firm* — Perman & Green

(57) ABSTRACT

A substrate transport apparatus for transporting substrates, the substrate transport apparatus including a frame, at least one transfer arm connected to the frame, at least one end effector mounted to the at least one transfer arm and at least one substrate support pad disposed on the at least one end effector, the at least one substrate support pad has a configuration that effects increased friction force, resulting from an increased friction coefficient, in at least one predetermined direction.

20 Claims, 13 Drawing Sheets

(56) References Cited

U.S. PATENT DOCUMENTS

2012/0315113 A1    12/2012   Hiroki
2014/0093336 A1     4/2014   Hiroki

FOREIGN PATENT DOCUMENTS

| KR | 20100029122 | 3/2010 |
|----|-------------|--------|
| TW | 490368 | 6/2002 |
| WO | 2008152940 | 6/2008 |
| WO | 2011096208 | 8/2011 |

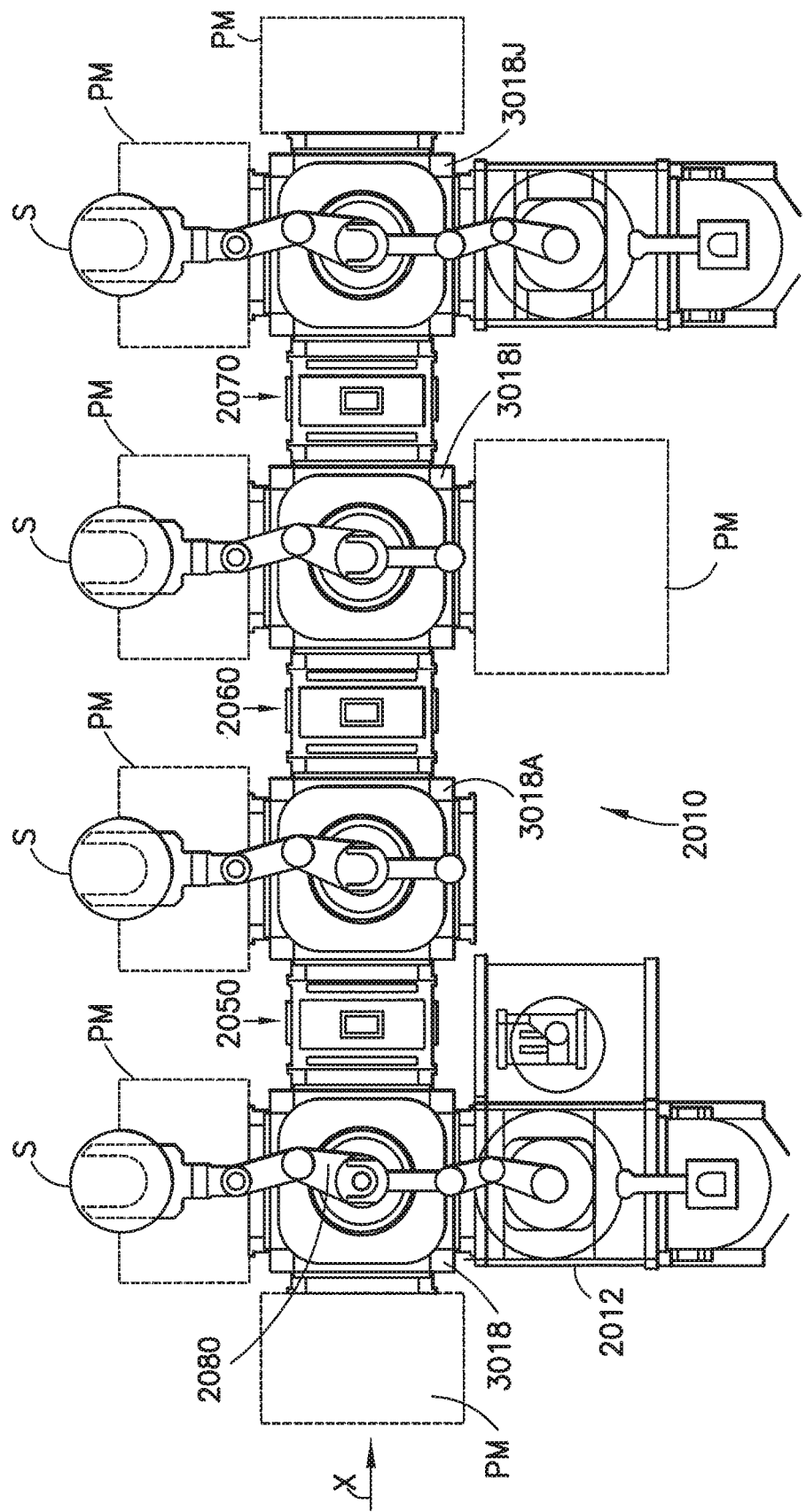

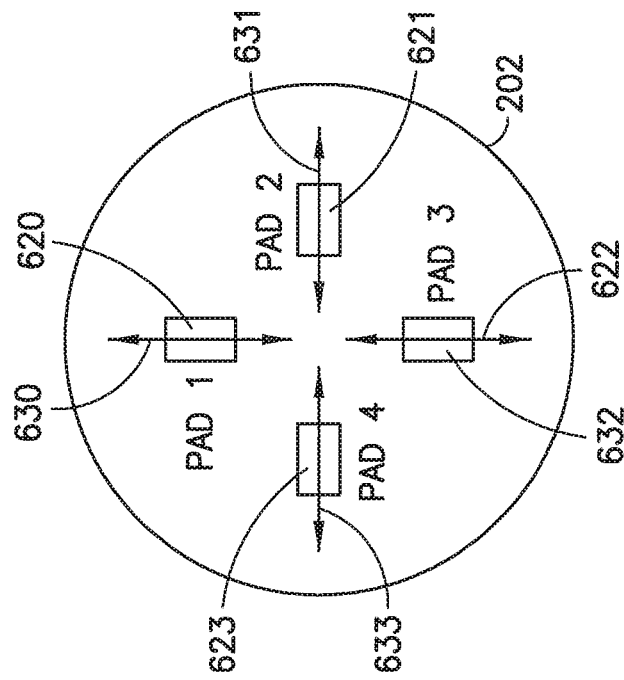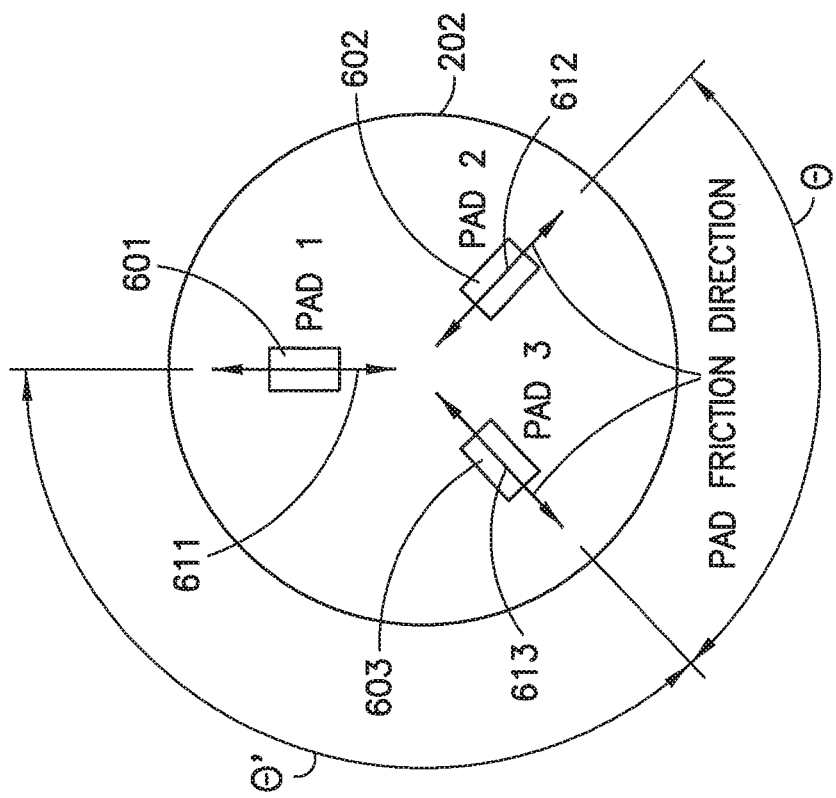

TRANSPORT APPARATUS

CROSS REFERENCE TO RELATED APPLICATIONS

This application is a continuation of U.S. patent application Ser. No. 14/365,277 filed on Jun. 13, 2014 (now U.S. Pat. No. 10,137,576, issued on Nov. 27, 2018), which is the National Stage of International Application NO. PCT/US2012/070095 having International Filing date, 17 Dec. 2012, which designated the United States of America, and which International Application was published under PCT Article 21 (s) as WO Publication No. 2013/090898 A1 which claims priority from and benefit of U.S. Provisional Patent Application No. 61/576,450 filed on Dec. 16, 2011, the disclosures of which are incorporated by reference herein in their entireties.

BACKGROUND

1. Field

The exemplary embodiments generally relate to transport apparatus and, more particularly, to robotic transport apparatus.

2. Brief Description of Related Developments

Generally transport apparatus employ end effectors or substrate holders that utilize passive contact (e.g. passive grip) between the substrate and the end effector. The maximum acceleration thresholds achieved with the passive grip end effectors may be heavily dependent on the choice of material used for passively contacting the substrate. Higher acceleration thresholds can be achieved with "rubber-like" materials such as Kalrez 4079, which is naturally more compliant than other materials such as alumina or quartz. On the other hand, the rubber-like materials tend to have higher adhesion forces which may be detrimental to substrate placement accuracy as well as process cleanliness. It is also noted that the rubber-like materials may not be capable of handling hot substrate. Materials like alumina and quartz are able to operate at higher temperatures and have lower adhesion forces than the rubber-like materials, however their acceleration thresholds (or friction coefficients) are reduced when compared to the rubber-like materials.

It would be advantageous to have a transport with a passive grip end effector that allows for maximized acceleration thresholds while maintaining at least low adhesion forces.

BRIEF DESCRIPTION OF THE DRAWINGS

The foregoing aspects and other features of the disclosed embodiments are explained in the following description, taken in connection with the accompanying drawings, wherein:

FIGS. 1A-1D are schematic views of processing tools in accordance with aspects of the disclosed embodiment;

FIGS. 6A-6E are schematic illustrations of a portion of a transport apparatus in accordance with aspects of the disclosed embodiment;

Figure 1A:
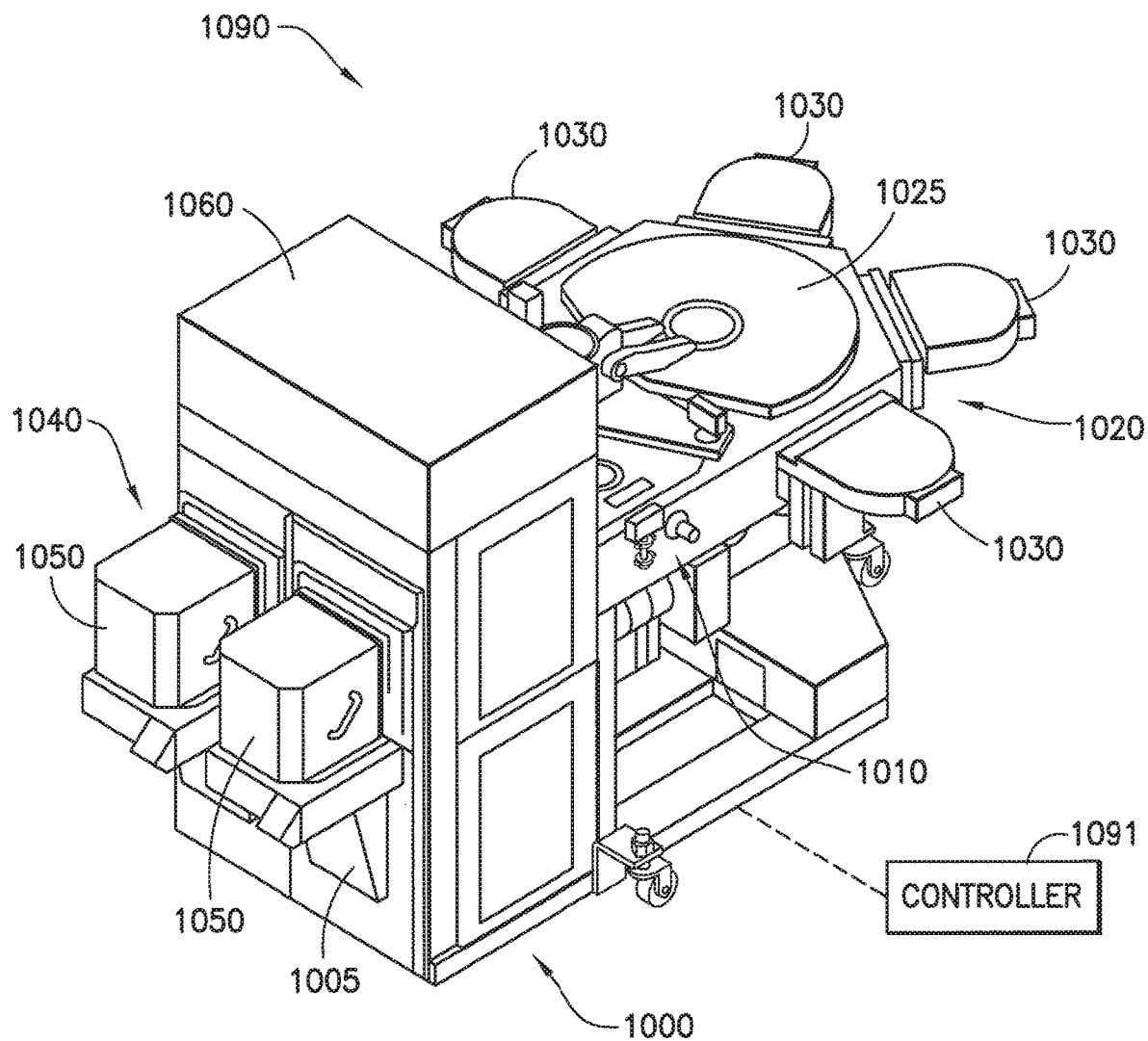

It is noted that the scale of the features illustrated in the drawings is for illustrative purposes only and is not representative of the actual scale of the features.

DETAILED DESCRIPTION

Although aspects of the disclosed embodiment will be described with reference to the drawings, it should be understood that the aspects of the disclosed embodiment can be embodied in many forms. In addition, any suitable size, shape or type of elements or materials could be used.

Referring to FIGS. 1A-1D, there are shown schematic views of substrate processing apparatus or tools incorporating aspects of the disclosed embodiment as disclosed further herein.

Figure 1B:
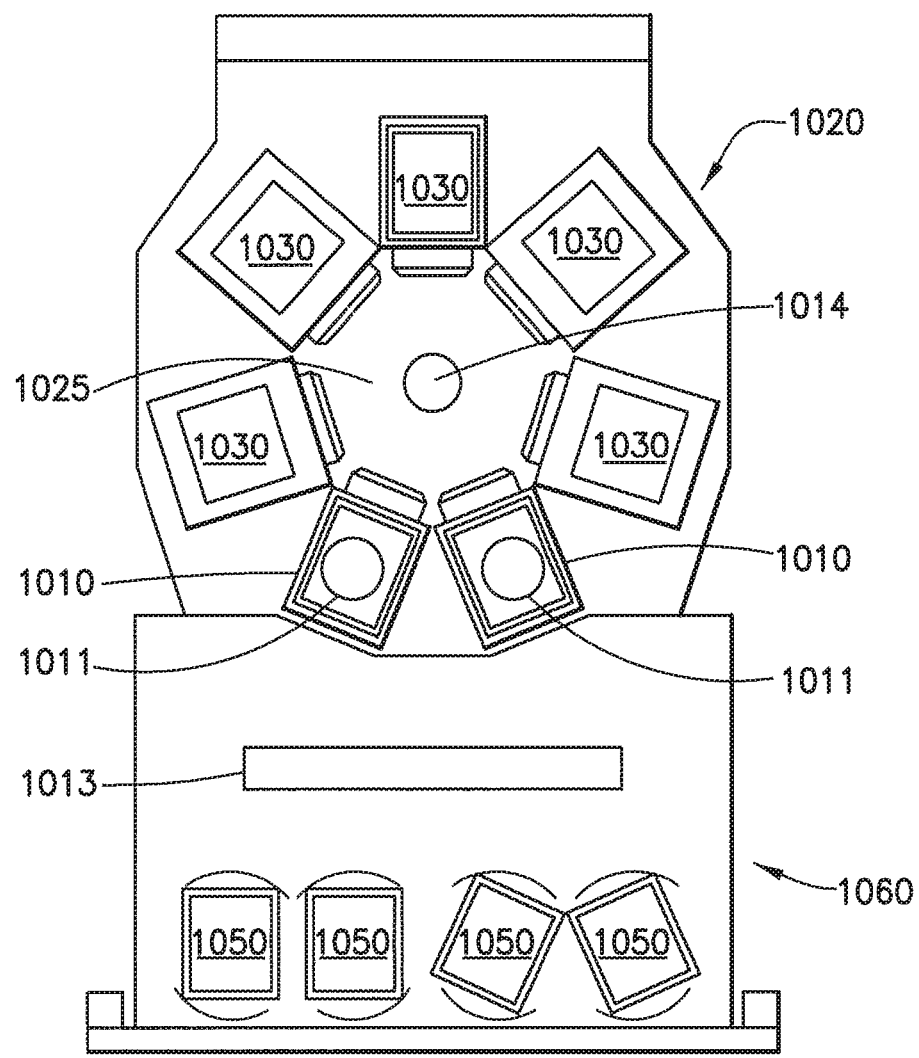

Referring to FIGS. 1A and 1B, a processing apparatus, such as for example a semiconductor tool station 1090 is shown in accordance with an aspect of the disclosed embodiment. Although a semiconductor tool is shown in the drawings, the aspects of the disclosed embodiment described herein can be applied to any tool station or application employing robotic manipulators. In this example the tool 1090 is shown as a cluster tool, however the aspects of the disclosed embodiments may be applied to any suitable tool station such as, for example, a linear tool station such as that shown in FIGS. 1C and 1D and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 1090 generally includes an atmospheric front end 1000, a vacuum load lock 1010 and a vacuum back end 1020. In other aspects, the tool station may have any suitable configuration. The components of each of the front end 1000, load lock 1010 and back end 1020 may be connected to a controller 1091 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In other aspects, any suitable controller and/or control system may be utilized.

It is noted that one or more of the tool modules may include a workpiece transport or robot (as described herein) for transferring the workpiece(s) throughout the tool. The workpiece transport may include an end effector (as described herein) for holding the workpiece(s) during transfer, and the end effector may include one or more contact pads with complaint microstructures and/or nanostructures that generate high directional friction forces against the workpiece(s) seated on the end effector substantially without increasing the adhesion forces (e.g. forces on the workpiece that may be substantially perpendicular to a plane of the workpiece) on the workpiece compared to conventional flat (e.g. non-directional friction) surfaces as will otherwise be described in greater detail below.

In the aspects of the disclosed embodiment, the front end 1000 generally includes load port modules 1005 and a mini-environment 1060 such as for example an equipment front end module (EFEM). The load port modules 1005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules and other components of the tool, as described herein, may be configured to interface with or otherwise operate on as 200 mm, 300 mm or 450 mm wafers or any other suitable size and shape of substrate such as for example larger or smaller wafers, rectangular or square wafers, or flat panels for flat panel displays, light emitting diodes or solar arrays. In other aspects the components of the tool, including for example the substrate transports, as described herein may be configured to handle hot wafers from any one or more of the semiconductor manufacturing processes described herein. Although two load port modules are shown in FIG. 1A, in other aspects any suitable number of load port modules may be incorporated into the front end 1000. The load port modules 1005 may be configured to receive substrate carriers or cassettes 1050 from an overhead transport system, automatic guided vehicles, person guided vehicles, rail guided vehicles or from any other suitable transport method. The load port modules 1005 may interface with the mini-environment 1060 through load ports 1040. The load ports 1040 may allow the passage of substrates between the substrate cassettes 1050 and the mini-environment 1060. The mini-environment 1060 generally includes a transfer robot 1013 as will be described in greater detail below. In one aspect of the disclosed embodiment the robot 1013 may be a track mounted robot such as that described in, for example, U.S. Pat. No. 6,002,840, the disclosure of which is incorporated by reference herein in its entirety. The mini-environment 1060 may provide a controlled, clean zone for substrate transfer between multiple load port modules.

The vacuum load lock 1010 may be located between and connected to the mini-environment 1060 and the back end 1020. The load lock 1010 generally includes atmospheric and vacuum slot valves. The slot valves may provide the environmental isolation employed to evacuate the load lock after loading a substrate from the atmospheric front end and to maintain the vacuum in the transfer chamber when venting the lock with an inert gas such as nitrogen. The load lock 1010 may also include an aligner 1011 for aligning a fiducial of the substrate to a desired position for processing. In other aspects, the vacuum load lock may be located in any suitable location of the processing apparatus and have any suitable configuration.

The vacuum back end 1020 generally includes a transfer chamber 1025, one or more processing station(s) 1030 and a transfer robot 1014. The transfer robot 1014 will be described below and may be located within the transfer chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transfer chamber 1025 to allow substrates to be passed from the transfer chamber 1025 to the processing stations 1030 and vice versa.

Referring now to FIG. 1C, a schematic plan view of a linear substrate processing system 2010 is shown where the tool interface section 2012 is mounted to a transfer chamber module 3018 so that the interface section 2012 is facing generally towards (e.g. inwards) but is offset from the longitudinal axis X of the transfer chamber 3018. The transfer chamber module 3018 may be extended in any suitable direction by attaching other transfer chamber modules 3018A, 3018I, 3018J to interfaces 2050, 2060, 2070 as described in U.S. patent application Ser. No. 11/442,511, previously incorporated herein by reference. Each transfer chamber module 3018, 3019A, 3018J, 3018J includes a substrate transport 2080 as will be described in greater detail below for transporting substrates throughout the processing system 2010 and into and out of, for example, processing modules PM. As may be realized, each chamber module may be capable of holding an isolated, controlled or sealed atmosphere (e.g. N2, clean air, vacuum).

Figure 1D:
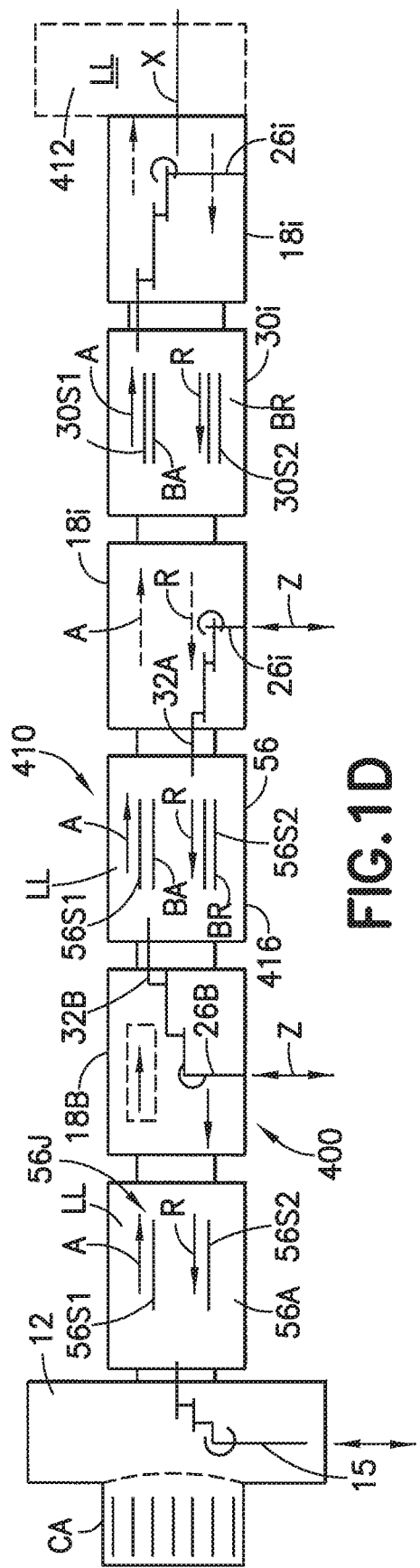
Figure 1E:
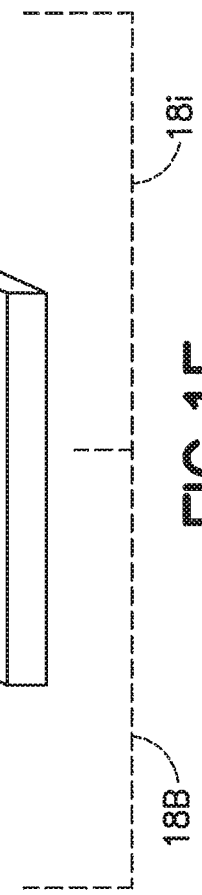
FIG. 1E is a schematic illustration of a transport cart in accordance with an aspect of the disclosed embodiment.

Referring to FIG. 1D, there is shown a schematic elevation view of an exemplary processing tool 410 such as may be taken along longitudinal axis X of the linear transfer chamber 416. In one aspect, as shown in FIG. 1D, the tool interface section 12 may be representatively connected to the transfer chamber 416. In this aspect, interface section 12 may define one end of the tool transfer chamber 416. As seen in FIG. 1D, the transfer chamber 416 may have another workpiece entry/exit station 412 for example at an opposite end from interface station 12. In other aspects, other entry/exit stations for inserting/removing work pieces from the transfer chamber may be provided such as between the ends of the tool transfer chamber 416. In one aspect of the disclosed embodiment, interface section 12 and entry/exit station 412 may allow loading and unloading of workpieces from the tool. In other aspects, workpieces may be loaded into the tool from one end and removed from the other end. In one aspect, the transfer chamber 416 may have one or more transfer chamber module(s) 18B, 18i. Each chamber module may be capable of holding an isolated, controlled or sealed atmosphere (e.g. N2, clean air, vacuum). As noted before, the configuration/arrangement of the transfer chamber modules 18B, 18i, load lock modules 56A, 56B and workpiece stations forming the transfer chamber 416 shown in FIG. 1D is merely exemplary, and in other aspects the transfer chamber may have more or fewer modules disposed in any desired modular arrangement. In one aspect station 412 may be a load lock. In other aspects, a load lock module may be located between the end entry/exit station (similar to station 412) or the adjoining transfer chamber module (similar to module 18i) may be configured to operate as a load lock. As also noted before, transfer chamber modules 18B, 18i have one or more corresponding transport apparatus 26B, 26i located therein. The transport apparatus 26B, 26i of the respective transfer chamber modules 18B, 18i may cooperate to provide the linearly distributed workpiece transport system 420 in the transfer chamber. In other aspects the transfer chamber modules 18B may be configured to allow any suitable transport cart 900 (FIG. 1E) to travel between transfer chamber modules 18B along at least a portion of the length of the linear transfer chamber 416. As may be realized the transport cart 900 may include any suitable transport apparatus mounted thereto and substantially similar to those transport apparatuses described herein. As shown in FIG. 1D, in one aspect the arms of the transport apparatus 26B may be arranged to provide what may be referred to as fast swap arrangement allowing the transport to quickly swap wafers from a pick/place location as will also be described in further detail below. The transport arm 26B may have a suitable drive section for providing each arm with three (3) (e.g. independent rotation about shoulder and elbow joints with Z axis motion) degrees of freedom from a simplified drive system compared to conventional drive systems. In other aspects, the drive section may provide the arm with more or less than three degrees of freedom. As seen in FIG. 1D, in one aspect the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transfer chamber along linear axis X of the transfer chamber. By way of example, workpiece(s) may be loaded into the transfer chamber 416 by interface section 12. The workpiece(s) may be positioned on the support(s) of load lock module 56A with the transport arm of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transfer chamber and may be loaded to and unloaded from any desired module (processing or otherwise) communicating with the transfer chamber. In other aspects, interstitial transfer chamber modules with static workpiece supports or shelves may not be provided between transfer chamber modules 18B, 18i. In such aspects of the disclosed embodiment, transport arms of adjoining transfer chamber modules may pass off workpieces directly (or through the use of a buffer station) from end effector or one transport arm to end effector of another transport arm to move the workpiece through the transfer chamber. The processing station modules may operate on the substrates through various deposition, etching, or other types of processes to form electrical circuitry or other desired structure on the substrates. The processing station modules are connected to the transfer chamber modules to allow substrates to be passed from the transfer chamber to the processing stations and vice versa. A suitable example of a processing tool with similar general features to the processing apparatus depicted in FIG. 1D is described in U.S. patent application Ser. No. 11/442,511, previously incorporated by reference in its entirety.

Referring now to FIG. 2A-E exemplary substrate transport apparatuses 200-204 are shown. The transport apparatuses 200-204 may be substantially similar to transport apparatus 26b, 26i, 1013, 1014, 2080 described above. In one aspect, the transport apparatus 200 may have a general SCARA arm configuration. Here the transport apparatus 200 for moving a semiconductor wafer 202 from one substrate holding station to another substrate holding station in the semiconductor fabrication process. The transport apparatus 200 includes an arm 220 mounted on a support or drive section 200D, such as a central column that houses a lifting mechanism (not shown) to raise and lower the arm vertically and a rotary drive for causing the extension and retraction of the arm 220. The arm 220 includes an inner arm 211, an outer arm 212, and the end-effector 213. The inner arm 211 is supported by the central column 200D at a rotatable "shoulder" joint 226 to effect rotation about a vertical axis through the central column 200D. Similarly, the outer arm 212 is mounted to the inner arm 211 at a rotatable "elbow" joint 228 for rotation about a vertical axis, and the end-effector 213 is mounted to the outer arm 212 at a rotatable "wrist" joint 232 for rotation about a vertical axis. Rotation about the three rotatable joints 226, 228 and 232 allows the end-effector 213 to move to any coordinate position in a horizontal plane, while translation of the arm 220 on the central column provides vertical motion. It will be appreciated that the presently disclosed embodiment can be used with other robotic arm configurations. For example, in other aspects, any suitable number of the arm links 211, 212 and end effector 213 may be driven by the drive section 213 in any suitable manner. It is noted that while only one arm having two arm links and one end effector is shown attached to the drive section in other aspects any suitable number of arms each having any suitable number of end effectors may be mounted to and driven by the drive section 200D. In other aspects the transport apparatus may have any suitable arm configuration such as a frog leg configuration 201, a bisymmetric configuration 202, leap-frog configuration 203, a linear sliding configuration 204, etc. Suitable examples of substrate transport apparatus can be found in U.S. patent application Ser. No. 12/117,415 entitled "SUBSTRATE TRANSPORT APPARATUS WITH MULTIPLE MOVABLE ARMS UTILIZING A MECHANICAL SWITCH MECHANISM" filed on May 8, 2008, Ser. No. 12/123,329 entitled "COMPACT SUBSTRATE TRANSPORT SYSTEM" filed on May 19, 2008 and U.S. Pat. Nos. 6,158,941, 6,464,448, 6,485,250, 7,578,649 and 8,016,541 the disclosures of which are incorporated herein by reference in their entireties.

Figure 3A:
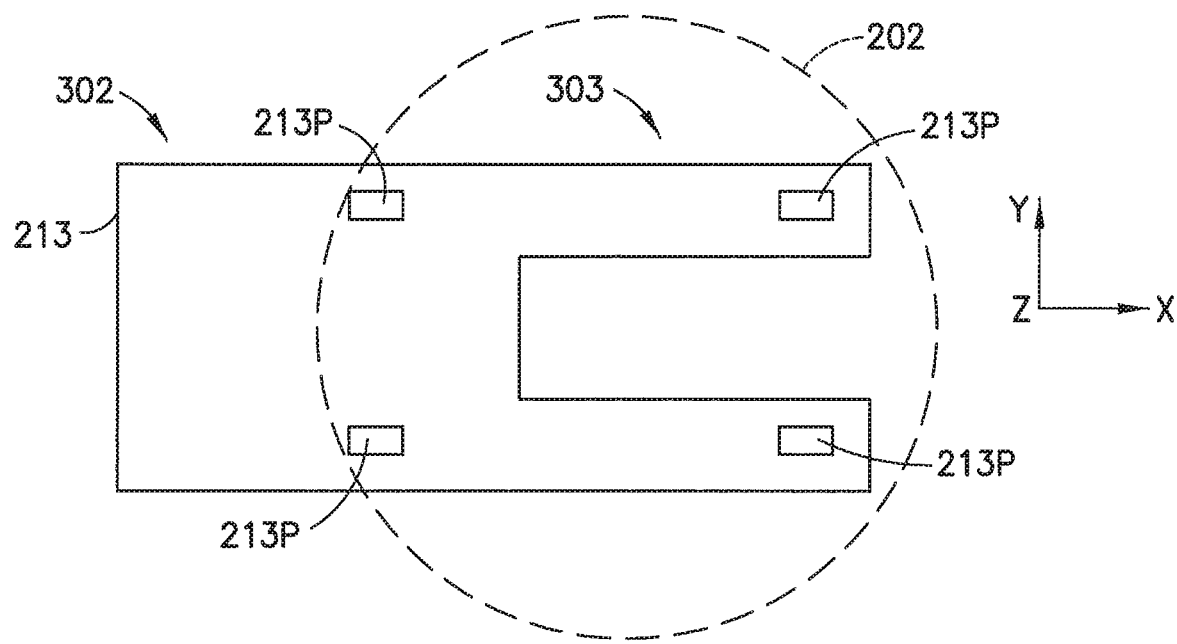
FIGS. 3A and 3B are schematic illustrations of a portion of a transport apparatus in accordance with aspects of the disclosed embodiment.

Referring now to FIG. 3 an exemplary end effector 213 is illustrated in accordance with an aspect of the disclosed embodiments. The end effector may have a base portion 302 and a substrate holding portion 303. The base portion 302 may be generally configured to allow the end effector 213 to be mounted for example to a wrist joint (e.g. wrist joint 232) or any other suitable joint of any of the transfer arms 200-204 described above while the substrate holding portion 303 may be generally configured to support and passively grip any suitable substrate 202 including but not limited to semiconductor substrates, flat panels, solar panels, light emitting diodes, organic light emitting diodes, etc.

The end effector 213 may be a one-piece member (e.g. monolithic member) or may be an assembly as desired to reduce weight of the end effector 213. The end effector 213 may be made from stiff light weight materials such as metals and/or composites including, but not limited, to carbon materials, plastics, Kalrez 4079, stainless steel, alumina, quartz or any other suitable materials. The end effector 213 may be substantially flat as shown or may have any other suitable configuration. The upper surface 324U of the end effector 213 may have any suitable substrate support structure. In one aspect the support structure may be one or more substrate support pads 213P configured to effect edge-gripping of the substrate 202. In this aspect, the pads 213P (four are shown for example purposes but in other aspect there may be more or less than four pads 213P) raised from the upper surface 324U. In one aspect, the pads 213P may be individually attached to the end effector 213 in any suitable manner such as through mechanical fasteners or bonding. In other aspects the pads 213P may be integrated into the monolithic end effector so as to form part of the one-piece structure of the end effector. It is noted that the locations of the substrate support pads 213P shown in the figures are merely exemplary and it should be understood that the substrate support pads may be arranged at any suitable location on the end effector. For example, in one aspect the substrate support pads 213P may be arranged to contact the substrate 202 in an exclusion area of the substrate (e.g. a periphery of the substrate, an outer edge, etc.) as defined in the SEMI (Semiconductor Equipment and Material International) standards or at any other suitable location(s) of the substrate 202 where contacting the substrate is allowed.

Figure 3B:
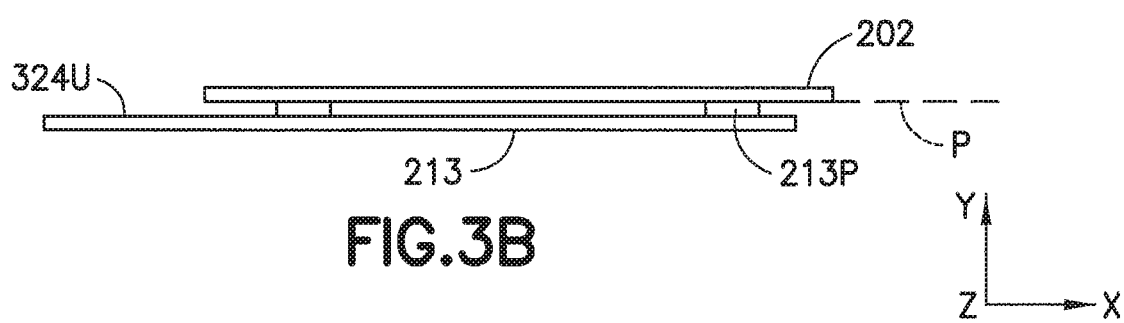
Figure 4:
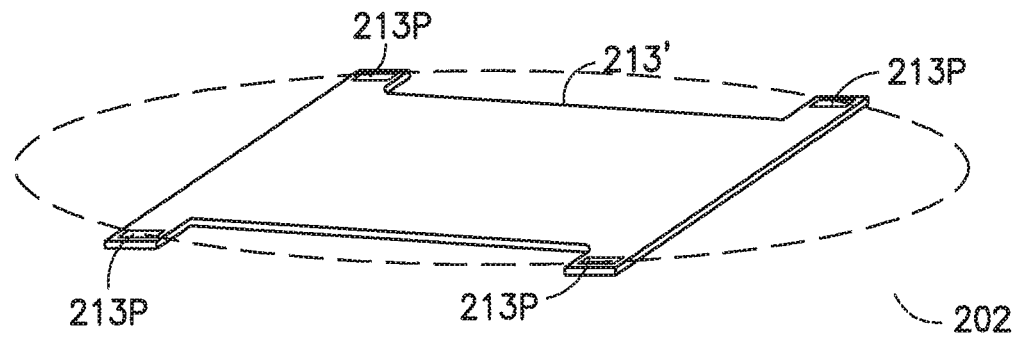
FIG. 4 is a schematic illustration of a portion of a transport apparatus in accordance with an aspect of the disclosed embodiment.

In one aspect the pads 213P may be arranged to contact a bottom surface of the substrate 202 (see e.g. FIGS. 3A and 3B) while in other aspects the pads 213P may be arranged to contact a perimeter edge of the substrate (see e.g. end effector 213' in FIG. 4). When the substrate is picked with the end effector 213, the substrate is seated on the pads 213P and a gap is formed as shown in FIG. 3B between the substrate 202 and upper surface 324U of the end effector 213. In one aspect the pads 213P may be passive pads while in other aspects, one or more pads may be provided that are movable (such as by pneumatic or electro-magnetic means) to engage the edge of the substrate and grip the substrate between the pads. In still other aspects one or more pads 213P may be selectably actuable (e.g. controllable) to change a position and/or orientation of the pad 213P relative to the end effector, substrate 202 or both the end effector and substrate 202 (see e.g. FIG. 6C where pad 640 is rotatable to orientation 640' so that angle β' is changed). For example, the position and/or orientation of the pad 213P may be changed manually, by swapping one end effector having predetermined pad orientation with another end effector having a different predetermined pad orientation or the pad 213P may be moved in any suitable manner (e.g. linearly or rotatably) by any suitable drive within the substrate transport. In yet other aspects a portion of the end effector 213 may be provided with a vacuum source (not shown) for at least in part securing the substrate 202 to the chuck. It is noted that the configuration and shape of the end effectors 213, 213' is exemplary only and in other aspects the end effector may have any suitable configuration and/or shapes. It is also noted that while the end effectors 213, 213' are configured and shown as holding one substrate 202 in other aspects the end effectors may be configured to support or hold any suitable number of substrates in one or more of a substantially stacked configuration (e.g. substantially in a vertical column) and a substantially side by side configuration (e.g. substantially in a horizontal row).

Figure 5:
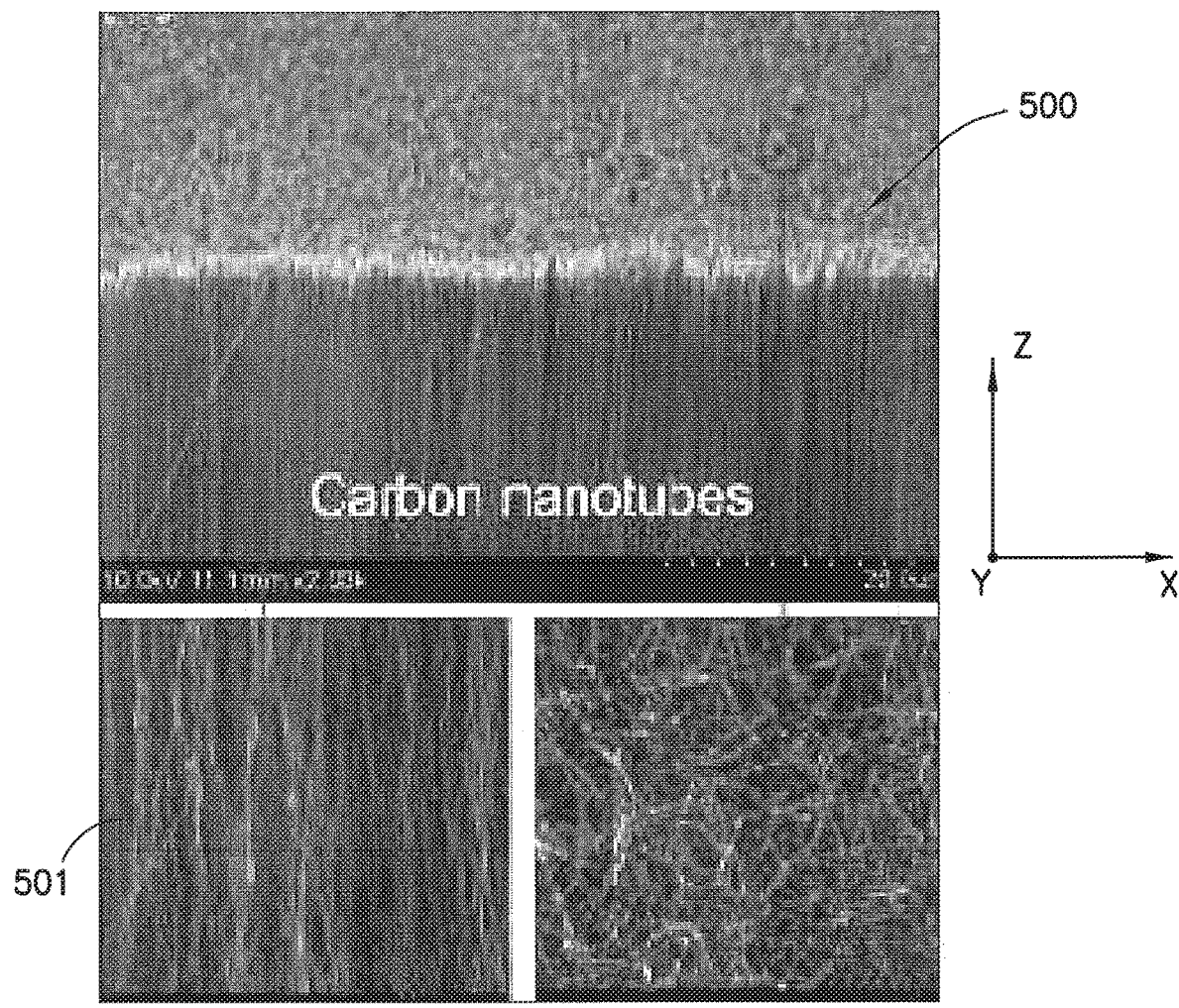
FIGS. 5 and 5A-5K are schematic illustrations of a portion of a transport apparatus in accordance with aspects of the disclosed embodiment.

Referring also to FIG. 5 each of the support pads 213P may include a predetermined surface profile configured to provide a predetermined coefficient of friction for passively gripping the substrate 202. The predetermined coefficient of friction is directionally variable in a predetermined manner so that the coefficient of friction is larger in one or more directions than in others and results in correspondingly larger predetermined friction force (e.g. from a common unit of normal force no the substrate 202) to passively grip the substrate 202 in those directions where the coefficient of friction is larger. In one aspect the predetermined surface profile of the support pads 213P may provide the material (which may be any suitable material) from which the pad is made a higher coefficient of friction (when compared to a pad of the same material without the predetermined surface profile) and lower adhesion forces while allowing the pads 213P to operate at higher temperatures (depending on the choice of material for the pads 213P). The pads 213P may be referred to herein as directional friction pads that utilize the principle of directional friction or "Gecko effect" in the design and fabrication of the surface of the pad 213P.

Figure 2A:
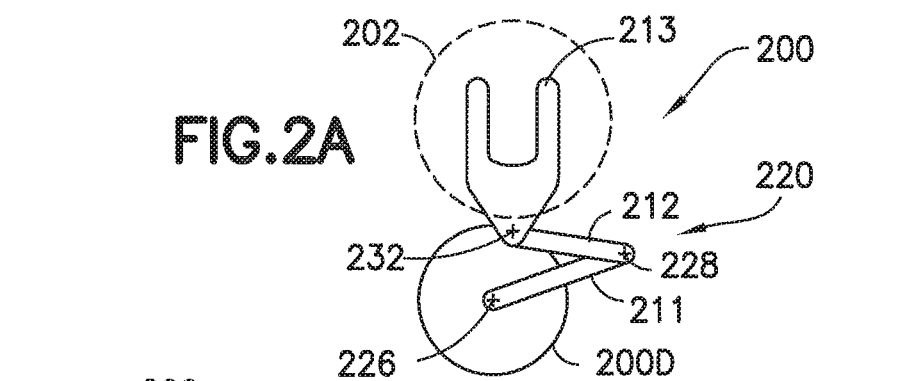
FIGS. 2A-2E are schematic illustrations of transport apparatuses in accordance with aspects of the disclosed embodiment.
Figure 2B:
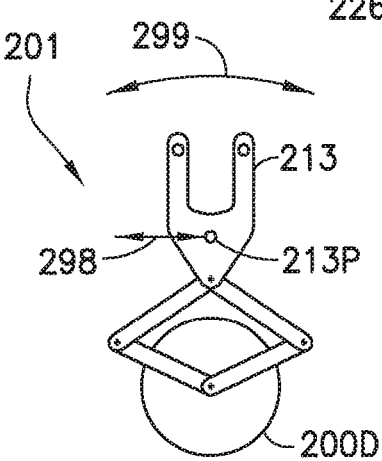
Figure 2C:
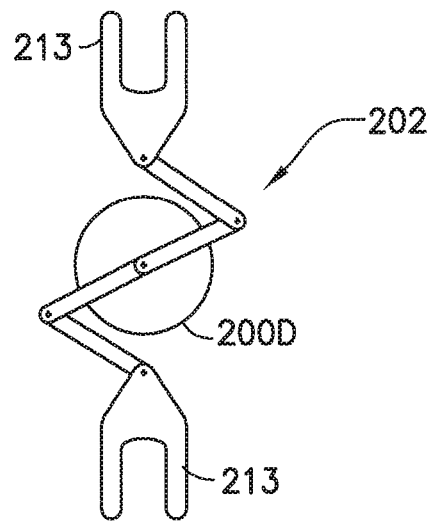
Figure 2D:
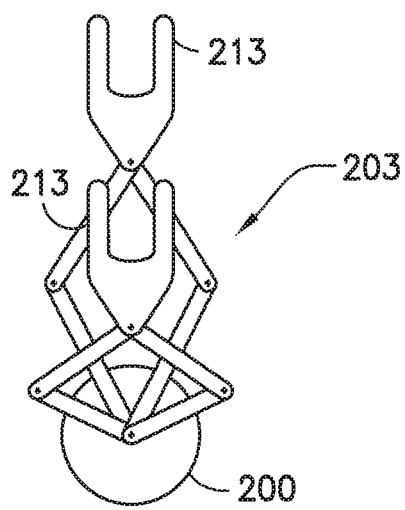
Figure 2E:
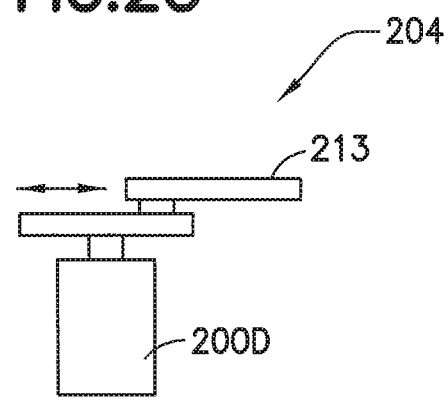
Figure 5A:
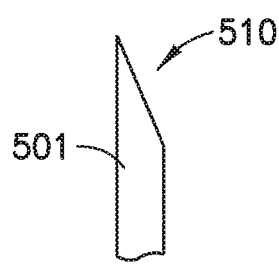
Figure 5B:
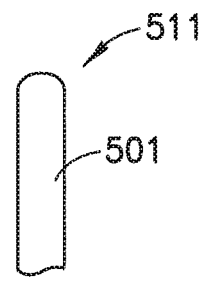
Figure 5C:
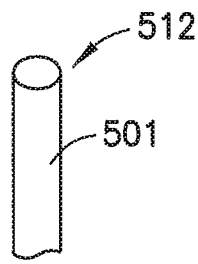
Figure 5D:
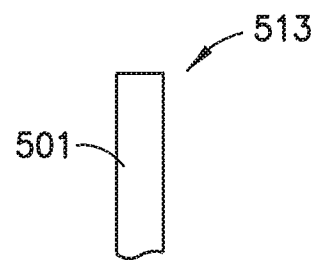
Figure 5H:
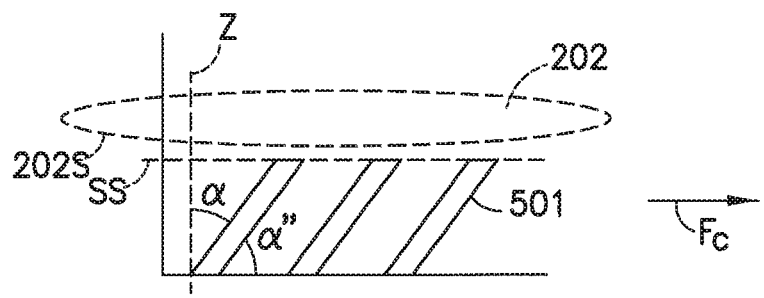
Figure 5I:
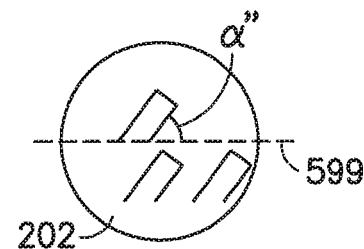
Figure 5J:
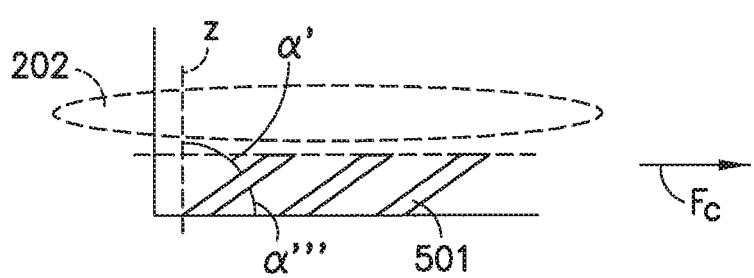
Figure 5K:
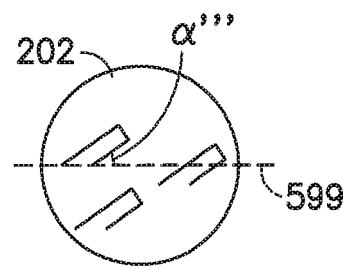

In one aspect the predetermined surface profile may include one or more arrays 500 of small asymmetric or symmetric hair-like features. As a non-limiting example, the arrays 500 may include any suitable aligned microscopic or nanoscopic columns or any other suitable microscopic and/or nanoscopic structures including but not limited to nanotubes (e.g. single-walled nanotubes and/or multi-walled nanotubes) or nanorods (e.g. substantially solid rod-like nanostructures), referred to collectively herein as nanostructures 501. In this aspect the nanostructures 501 are aligned substantially in a vertical direction (FIG. 5) along the Z-axis for horizontally supporting a substrate 202 but in other aspects the nanostructures 501 may be aligned in any suitable direction for supporting or otherwise holding a substrate in any suitable orientation. For example, in another aspect, referring to FIGS. 5E, 5F and 5G, the nanostructures 501 may be angled by any suitable amount ψ with respect to the Z-axis for horizontally supporting a substrate 202. It is noted that the nanostructures 501 may also be angled relative to a predetermined axis or direction of friction/resistance as will be described below. The nanostructures 501 may provide a variable friction force due to direct variance in the coefficient of friction provided by the nanostructures 501 on, for example, the substrate 202 in any suitable direction. In one aspect, the direction for the increased friction force that results from a higher coefficient of friction is selected to correspond to higher expected inertial loads due to motion. Referring briefly to FIG. 2B, for exemplary purposes only, where the transport robot is to be rotated about a central axis in the direction of arrow 299, the direction for the increased friction force may be in the direction of arrow 298 due to expected inertial loads on the substrate 202 resting on pads 213P during movement in the direction of arrow 299. For example, the variable frictional force may be along an axis of a respective substrate support pad as will be described below or in any suitable direction. In other aspects the nanostructures 501 may be arranged so that the variable friction force may be applied to the substrate 202 in more than one direction (e.g. along more than one axis where the directions are angled relative to one another).

Figure 5G:
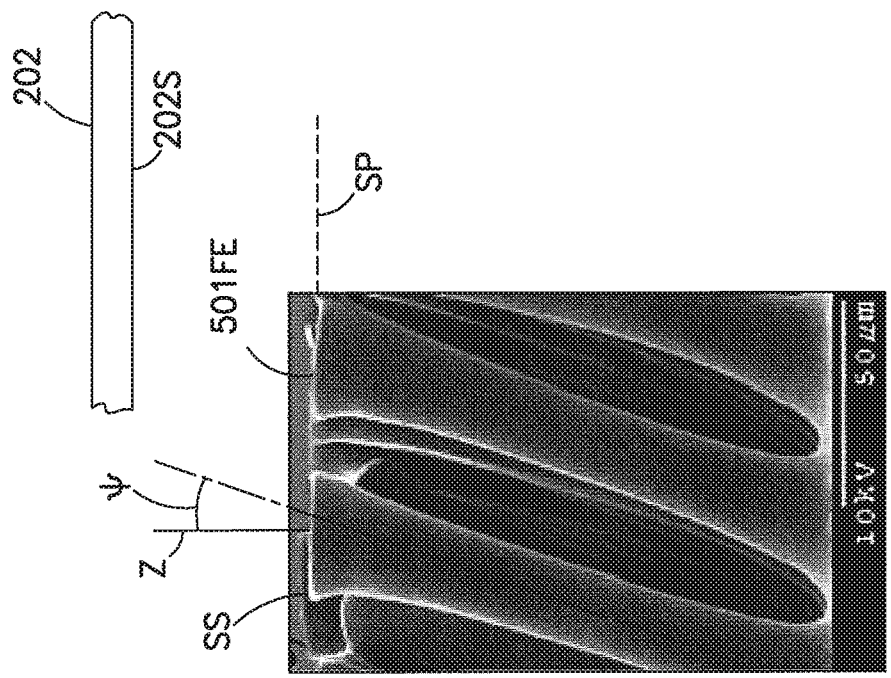
Figure 5F:
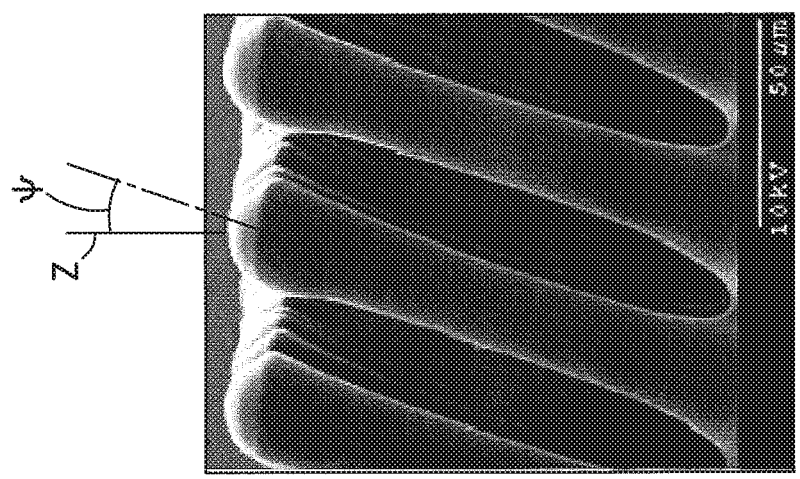
Figure 5E:
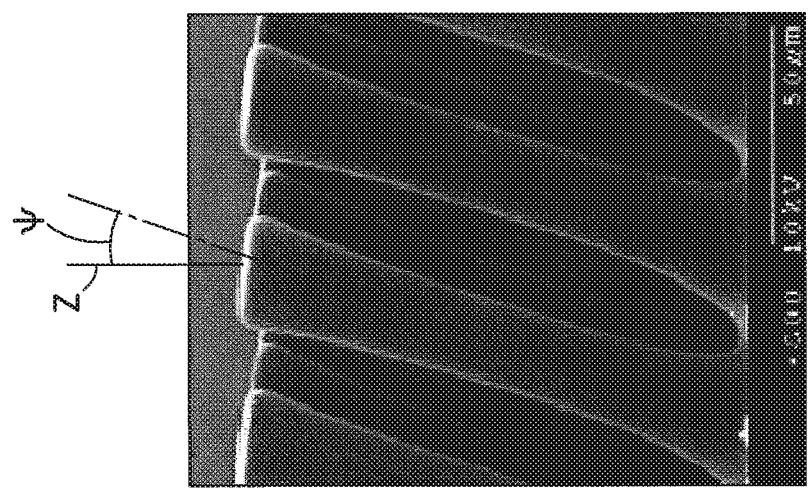

In one aspect, referring briefly to FIG. 5G, for exemplary purposes only, the nanostructures 501 may be arranged so that the free ends 501FE of the nanostructures 501 define a substrate contact/seating surface SS having a surface plane SP that is substantially aligned with a substrate surface 202S so that contact from the substrate support pad 500 is substantially normal to the substrate surface 202S. In other aspects the seating surface (including the surface plane SP) may be arranged at an incline relative to the substrate surface 202S so that a contour of the substrate support pad 213P is angled relative to the substrate surface in, for example, a direction of friction between the substrate support pad 213P and the substrate 202. In still other aspects the seating surface may be arranged so that the contour of the support pad 213P has any suitable orientation relative to the direction of friction between the substrate support pad 213P and the substrate 202.

Each nanostructure 501 of the array 500 may be constructed of any suitable material including, but not limited to, carbon materials, plastics, Kalrez 4079, stainless steel, alumina, quartz or any other suitable materials that may be compliant with the weight of a substrate 202 exerted thereon (e.g. the nanostructures 501 deflect under the weight of the substrate—see FIGS. 5J and 5K which illustrates compliant angled nanostructures) or noncompliant with the weight of the substrate exerted thereon (e.g. the nanostructures 501 substantially do not deflect under the weight of the substrate—see FIGS. 5H and 5I which illustrate substantially noncompliant angled nanostructures) as will be described in greater detail below. As may be realized, the material selected for the nanostructure may be dependent on a temperature of the substrate being carried. As an example, the temperature of a substrate 202 as it is carried by the end effector may be between about 250° C. (or less) and about 800° C. (or more). To enable the end effector to transport hot or high temperature substrates (e.g. substrates having a temperature of about 300° C. or more) the substrate support pads 213P may be constructed of a high temperature tolerant material that may have a high coefficient of friction with the substrates being carried by the end effector (such as for example, silicon wafers, glass substrates, sapphire substrates, etc.).

Referring also to FIGS. 5H and 5I (as well as FIGS. 5J and 5K) the nanostructures 501 are illustrated as being angled in a direction of resistance Fc (e.g. the direction of an axis along which the frictional force is applied to the substrate 202 by the nanostructures 501). In one aspect the direction of resistance Fc may be a direction of maximum resistance. As may be realized, the direction of resistance Fc may also be a arranged along a predetermined axis or axes relative to one or more of the substrate support pad and substrate 202. In other aspects the nanostructures 501 may be angled in any suitable direction such as for example, in a direction substantially opposite the direction of resistance Fc. In still other aspects the direction of resistance Fc may be angled with respect to the direction of pitch of the nanostructures 501. Angling/pitching the nanostructures 501 may increase a surface contact area between the respective nanostructures 501 and the substrate 202 which may increase the coefficient of friction between the nanostructures 501 and the substrate 202. In one aspect, the nanostructures 501 of the array 500 may be configured such that the array 500 is substantially noncompliant from the applied weight of the substrate. For example, the nanostructures 501 may be arranged substantially at an angle/pitch relative to the Z-axis before and after the substrate 202 is placed on the nanostructures 501. As may realized, the nanostructures 501 may also be angled relative to an axis 599 of resistance by any suitable angle α" as shown in FIG. 5I.

In another aspect, also referring to FIGS. 5J and 5K, the nanostructures 501 of the array 500 may be configured such that the array 500 exhibits high compliance from the applied weight of the substrate due to buckling and bending of the nanostructures 501. For example, in a relaxed (e.g. unloaded) state the nanostructures 501 may be arranged at angle α (FIG. 5H) relative to the Z axis. Where the nanostructures 501 are compliant nanostructures, upon loading the substrate 202 (e.g. upon contact of the substrate 202 with the nanostructures) onto the array 500, the nanostructures may deflect by any suitable amount so that the angle α changes to α'. The direction of deflection or bending of the nanostructures 501 may be in the direction of resistance Fc (e.g. the nanostructure deflection increases a pitch of the nanostructures towards the direction of resistance). In other aspects the deflection of the nanostructures 501 may be in a direction substantially opposite to the direction of resistance Fc. As noted above, the nanostructures 501 may also be angled relative to an axis 599 of resistance by any suitable angle α'" as shown in FIG. 5K.

In one aspect the compliance of the nanostructures may allow for and enable substantial interfacial contact between the nanostructures 501 and a surface (e.g. bottom and or edges) of the substrate 202. This substantial interfacial contact between the nanostructures 501 and the substrate 202 may provide high dynamic friction in the plane of the substrate (e.g. in the X-Y plane, see FIGS. 3A, 3B). It is also noted that the normal load exerted on the nanostructures 501 from the weight of the substrate 202 appears positive over the loading cycle of the nanostructures, e.g. the array 500 supports compression while producing substantially no tensile resistance (e.g. substantially no adhesion) during placement of the substrate 202 at a suitable substrate holding location when the substrate 202 is placed through movement of the end effector 213 substantially normal to the vertical arrangement of the array (e.g. substantially vertical to the surface plane of the substrate 213 or the X-Y plane).

The nanostructure array 500 may be formed on or integral with the pads 213P in any suitable manner including but not limited to microcasting or other molding process, arc discharge, laser ablation, high-pressure carbon monoxide, and chemical vapor deposition (CVD). In other aspects the nanostructure array 500 may be formed on any suitable substrate that is affixed to the pad 213P in any suitable manner. Each nanostructure 501 may have any suitable tip shape such as for example, a tapered tip 510 (FIG. 5A), a convex tip 511 (FIGS. 5B and 5F), a concave tip 512 (FIG. 5C) (or other rounded tip), a substantially flat tip 513 (FIGS. 5D and 5E), and a spatula or otherwise flared tip (FIG. 5G). In one aspect the shape of the tips of the nanostructures 501 may depend on a degree of compliance of the nanostructures 501 from the weight of the substrate 202 so that a maximum surface contact area is provided between the nanostructure array 500 and the substrate 202. In other aspects the sides of the nanostructures 501 (in lieu of or in addition to contact between the tips of the nanostructures and the substrate) may provide at least in part directional friction as a result of the compliance of the nanostructures 501 as noted above.

Referring now to FIGS. 6A and 6B the pads 213P may be arranged on the end effector 213 in a cooperative way such that the pads are oriented to provide a high coefficient of friction in any direction along the plane or pad contact surface of the substrate 202. In one aspect frictional forces may be applied to the substrate 202 by the pads 213P in one or more directions. The orientation of each of the pads 213P may be based on a predetermined direction in which the frictional forces are applied and/or on a predetermined frictional force profile. For example, referring to FIG. 6A the end effector (which may be substantially similar to end effector 213 or 213') may have three substrate support pads 601-603 arranged in any suitable manner on the surface (or integrally formed with) the end effector. Each substrate support pad 601-603 may be substantially similar to pads 213P described above such that the nanostructures 501 of the pads 601-603 provide frictional forces substantially along a respective direction 611-613. Similarly, referring to FIG. 6B, in another aspect the end effector may have four substrate support pads 620-623. In this aspect the support pads 620-623 are arranged in substantially orthogonal pairs (e.g. pads 630, 632 are arranged substantially orthogonally to pads 621, 623) where the pads 620-623 provide frictional forces along a respective direction 630-633. It is noted that while the directions 611-613, 630-633 of the frictional forces are illustrated with bidirectional arrows it should be understood that the frictional forces provided by the individual nanostructures 501 or as a pad 500 collectively may act in a single direction, bidirectionally and/or in multiple directions that are angled relative to one other. It is also noted that while the pads 601-603, 620-623 are arranged symmetrically in other aspects (as will be described below) the pads may be arranged asymmetrically. In still other aspects the pads may have a combined symmetric and asymmetric arrangement.

In this aspect, it is noted that the pads 601-603 have a rectangular shape where the frictional forces are provided substantially along a longitudinal axis of the pads. In other aspects the frictional forces provided by the nanostructures 501 may be provided in any suitable direction or combination of directions relative to the pads. It is also noted that in other aspects the pads may have any suitable shape. In this aspect, the pads 601-603 are arranged so that the directions 611-613 of the frictional forces provided by the pads are arranged at any suitable angle θ relative to each other. It is noted that in one aspect the angles between the force directions 611-613 for each pad may vary such as shown in FIG. 6A where, for example, pads 602 and 603 are arranged at angle θ and pad 601 is arranged at angle θ' relative to pads 602 and 603). In other aspects the angles between each of the force directions for each pad may be equiangular. It should also be understood that while three pads are shown in FIG. 6A in other aspects any suitable number of pads may be used.

It is noted that the arrangement of the frictional forces provided by the substrate support pads 213P, 601-603, 620-623, 640-643, 650-655, 670-675 (FIGS. 6A-6E) may be dependent on, for example, an acceleration vector (or other inertial factor) that is applied to the substrate 202 as the substrate 202 is carried by the end effector 213, 213'. For example, as described above each pad may have a direction along a linear axis that is capable of generating a maximum frictional coefficient. The pads 213P, 601-603, 620-623, 640-643, 650-655, 670-675 may be positioned on the end effector 213, 213' in a predetermined pattern relative to each other such that their combined behavior can counteract or otherwise provide a high coefficient of friction against the acceleration vector applied to the substrate 202 substantially along the plane P (FIG. 3B) of the substrate 202. It is noted that the acceleration exerted on the substrate 202 as it is moved on the end effector may be from about 0.1 g (or less) to about 0.3 g (or more).

Referring to FIG. 6B four substrate support pads 620-623 are shown. The pads 620-623 may be substantially similar to pads 213P described above. In this aspect the pads 620-623 are arranged so that the frictional force directions 630-633 of each of the pads 620-623 are substantially ninety degrees apart. In other aspects the pads may have any suitable arrangement for providing any suitable applied frictional forces to the substrate 202.

Figure 6C:
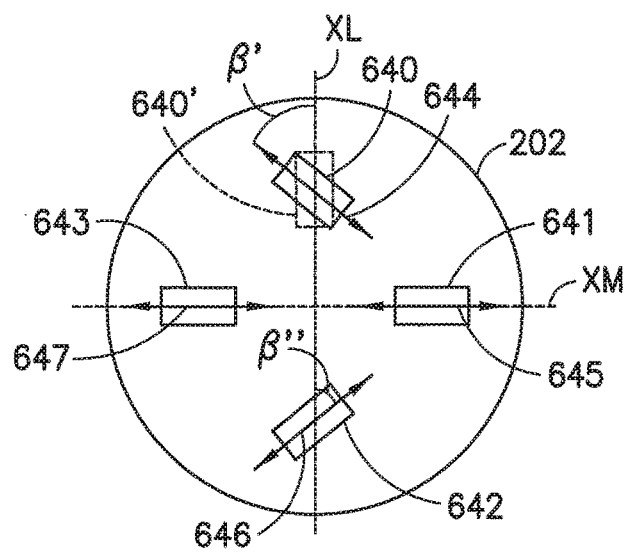
Figure 6D:
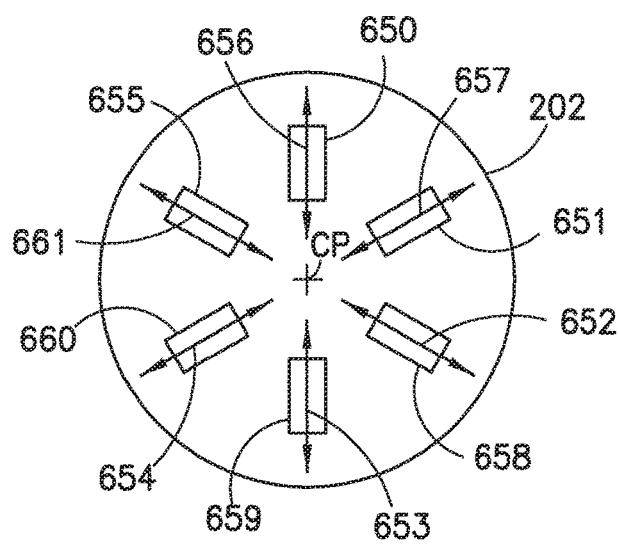
Figure 6E:
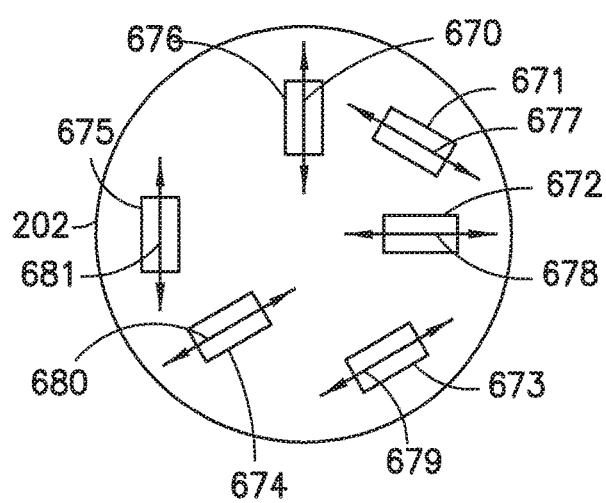

Referring now to FIGS. 6C-6E other exemplary arrangements of substrate support pads 640-643, 650-655, 670-675 are illustrated in accordance with aspects of the disclosed embodiment. The substrate support pads 640-643, 650-655, 670-675 may be substantially similar to those described above where the frictional forces provided by each pad may be applied in a single direction or bidirectionally in the direction of their respective arrows 644-647, 656-661, 676-681. As noted above, the frictional forces provided by each substrate support pad 640-643, 650-655, 670-675 may be applied in more than one direction and is not limited to an application along the respective arrows 644-647, 656-661, 676-681.

As can be seen in FIG. 6C there are four substrate support pads 640-643 arranged in pairs. In other aspects there may be any suitable number of substrate support pads that may be arranged in pairs, other groupings or singularly. Pads 640, 642 may be angled relative to axis XL by their respective angles β', β". As noted above, the angles β', β" may be adjustable/actuable so that an orientation of the pads 640, 642 changes. In one aspect the angles β', β" may be substantially the same while in other aspects the angles β', β" may be different from each other. The pads 641, 643 may be substantially arranged along a common axis XM which may be oriented at any suitable angle relative to axis XL. In other aspects the pads 641, 643 may not be arranged along a common axis and may have any suitable angular relationship with pads 640, 642.

FIG. 6D illustrates a substrate support pad arrangement where the substrate support pads 650-655 are arranged radially. For example, the directions in which the frictional forces of each pad are applied may converge, diverge, or a combination of converge and diverge from a central point CP which may coincide with a center of the substrate 202. It should be understood that while six substrate support pads 650-655 are illustrated, in other aspects any suitable number of substrate support pads may be provided.

As may be realized, the substrate support pads may be arranged so that any suitable force profile/directions are provided. For example, FIG. 6E illustrates a substrate support pad arrangement having pads 670-675 where the frictional forces of each pad are applied along a respective direction (e.g. in the direction of a respective arrow 676-681). As may be realized each frictional force direction of a respective pad 670-675 may be different from one or more other frictional force directions provided by other ones of the pads 670-675. It is noted that in one aspect one or more pads 670-675 may apply frictional forces in a substantially common direction.

Figure 7B:
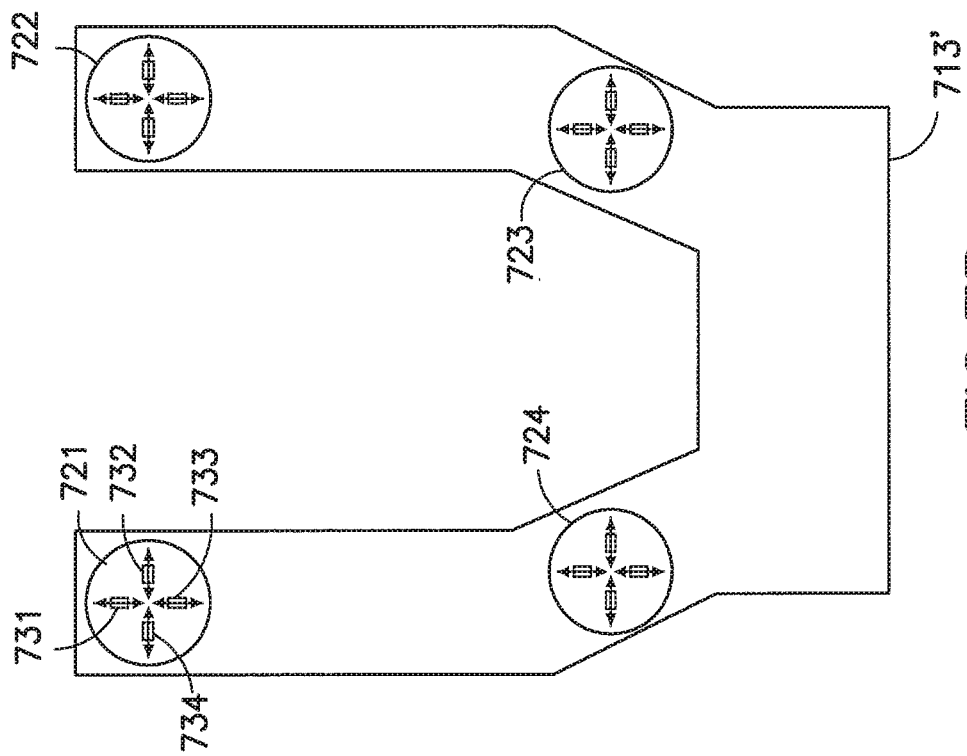
FIGS. 7A and 7B are schematic illustrations of a portion of a transport apparatus in accordance with aspects of the disclosed embodiment.
Figure 7A:
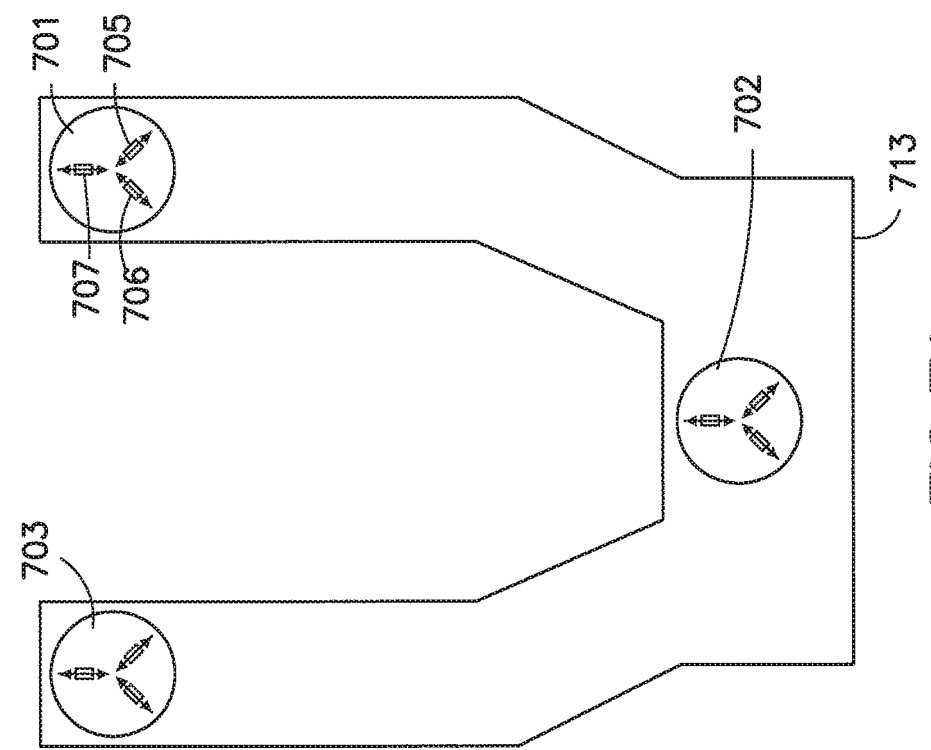

Referring to FIGS. 7A and 7B, in one aspect the end effector 713, 713' (which may be substantially similar to end effectors 213, 213') may have any suitable number of substrate support pads where each substrate support pad includes one or more directional pads. For example, referring to FIG. 7A, the end effector 713 includes three substrate support pads 701-703 where each pad has three directional pads 705-707 that may be arranged in a manner substantially similar to pads 601-603 or in any other suitable arrangement as described above. Referring to FIG. 7B, the end effector 713' includes four substrate support pads 721-724 each having four directional pads 731-734 that may be arranged in a manner substantially similar to pads 620-623 or in any other suitable arrangement described above.

Figure 8:
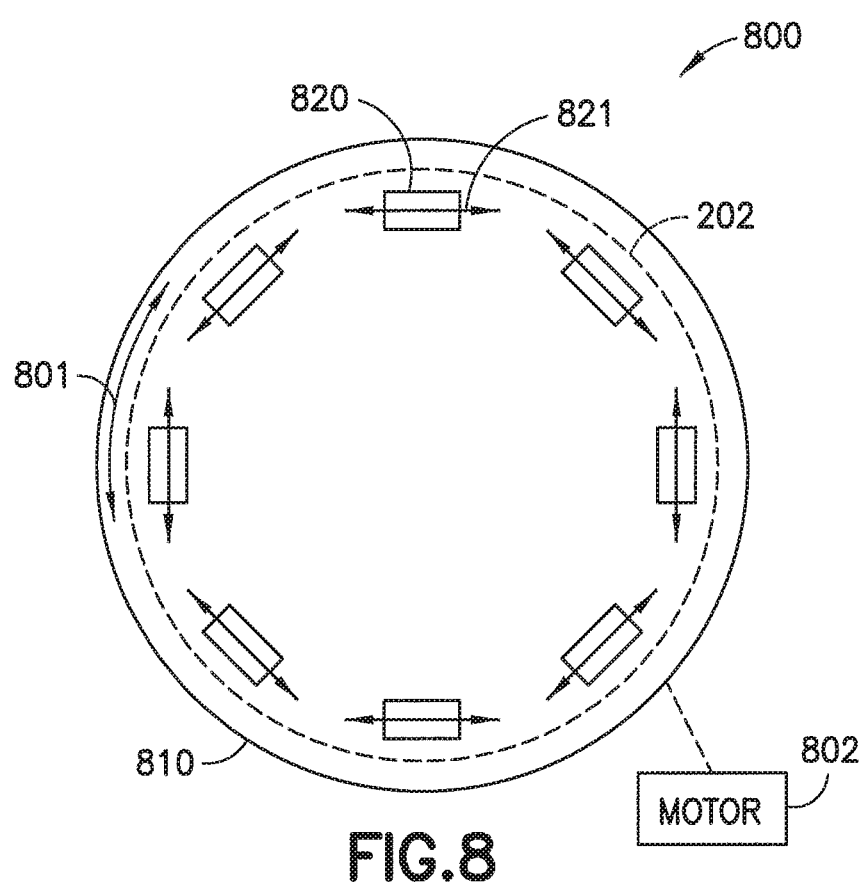
FIG. 8 is a schematic illustration of a substrate holding device in accordance with an aspect of the disclosed embodiment.

In other aspects, referring to FIG. 8 the directional friction pads as described herein may be used with rotary devices 800 such as any device employing a rotary chuck 810. One example of rotary chuck device is a substrate aligner. In one aspect the chuck 810 may include any suitable number of substrate support pads 820 that may be substantially similar to those described above. For exemplary purposes only eight pads 820 are shown in FIG. 8 but is should be understood that the chuck 810 may have more or less than eight pads. Each pad 820 may be arranged relative to the direction of rotation 801 of the chuck 810 so that the force direction 821 provided by the nanostructures 501 of each pad is substantially tangential to the direction of rotation 801. In other aspects the pads 820 may be arranged so that the force directions 821 of each pad has any suitable directional relationship relative to the direction of rotation 801.

In accordance with one or more aspects of the disclosed embodiment, a substrate transport apparatus for transporting substrates is provided. The substrate transport apparatus includes a frame, at least one transfer arm connected to the frame, at least one end effector mounted to the at least one transfer arm and at least one substrate support pad disposed on the at least one end effector. The at least one substrate support pad has a configuration that effects increased friction force, resulting from an increased friction coefficient, in at least one predetermined direction.

In accordance with one or more aspects of the disclosed embodiment, the at least one substrate support pad is configured to apply a directional friction force in a plane of the substrate substantially without providing a force on the substrate in a direction substantially perpendicular to the plane of the substrate.

In accordance with one or more aspects of the disclosed embodiment, the at least one substrate support pad forms a monolithic structure with a respective one of the at least one end effector.

In accordance with one or more aspects of the disclosed embodiment, the friction forces are directional friction forces where a direction in which a friction force of each of the at least one substrate support pads acts is dependent on an acceleration vector of the substrate along a plane of the substrate.

In accordance with one or more aspects of the disclosed embodiment, each of the at least one substrate support pad includes at least one directional friction pad where each directional friction pads includes surface features configured to apply the increased friction force, resulting from an increased friction coefficient, in at least one predetermined direction.

In accordance with one or more aspects of the disclosed embodiment, the at least one directional friction pad includes more than one directional friction pad where the at least one predetermined direction of each directional friction pad converges at a common point.

In accordance with one or more aspects of the disclosed embodiment, the at least one substrate support pad includes more than one substrate support where the at least one predetermined direction of each substrate support pad converge on a common point of a respective one of the at least one end effector.

In accordance with one or more aspects of the disclosed embodiment, each of the at least one substrate support pad includes one or more of microscopic and nanoscopic structures that provide the friction forces.

In accordance with one or more aspects of the disclosed embodiment, the at least one substrate support pad is controllable so that an orientation of the at least one substrate support changes from one direction to another direction.

In accordance with one or more aspects of the disclosed embodiment, the at least one substrate support pad is configured to support a hot wafer.

In accordance with one or more aspects of the disclosed embodiment, a substrate holding device is provided. The substrate holding device includes a drive section and a substrate support connected to the drive section. The substrate support includes at least one substrate support pad having a configuration that effects increased friction force, resulting from an increased friction coefficient, in at least one predetermined direction.

In accordance with one or more aspects of the disclosed embodiment, the drive section is configured to rotate the substrate support about an axis of rotation.

In accordance with one or more aspects of the disclosed embodiment, at least one predetermined direction of each of the at least one substrate support pad is oriented tangentially relative to rotation of the substrate support.

In accordance with one or more aspects of the disclosed embodiment, the substrate holding device includes at least one arm link rotatably coupled to the drive section and the at least one substrate support is rotatably coupled to the at least one arm link.

In accordance with one or more aspects of the disclosed embodiment, the at least one substrate support pad is configured to apply the directional friction force in a plane of the substrate substantially without providing a force on the substrate in a direction substantially perpendicular to the plane of the substrate.

In accordance with one or more aspects of the disclosed embodiment, the at least one substrate support pad forms a monolithic structure with a respective one of the at least one substrate support.

In accordance with one or more aspects of the disclosed embodiment, each of the at least one substrate support pad includes at least one directional friction pad where each of the at least one directional friction pads includes surface features configured to apply directional friction forces in a predetermined direction relative a respective one of the at least one substrate support pads. In a further aspect, the at least one directional friction pad includes more than one directional friction pad where the predetermined direction of each directional friction pad converge on a common point of a respective directional friction pad.

In accordance with one or more aspects of the disclosed embodiment, the at least one substrate support pad includes more than one substrate support where the at least one predetermined direction of each substrate support pad converge on a common point of a respective one of the at least one substrate support.

In accordance with one or more aspects of the disclosed embodiment, each of the at least one substrate support pad includes one or more of microscopic and nanoscopic structures that provide the friction forces.

In accordance with one or more aspects of the disclosed embodiment, the at least one substrate support pad is controllable so that an orientation of the at least one substrate support changes from one direction to another direction.

In accordance with one or more aspects of the disclosed embodiment, the at least one substrate support pad is configured to support a hot wafer.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

The invention claimed is:

1. A substrate transport apparatus for transporting substrates, the substrate transport apparatus comprising:
    a frame;
    at least one transfer arm connected to the frame;
    at least one end effector mounted to the at least one transfer arm; and
    at least one passive substrate support pad disposed on the at least one end effector so that the at least one passive substrate support pad is fixed to the at least one end effector in a fixed position relative to the at least one end effector so as to hold a substrate on the at least one passive substrate support pad, the at least one passive substrate support pad has a configuration that passively effects, substantially coincident with the substrate coming in contact with the at least one end effector by coming into contact with at least one predetermined contact area of the at least one passive substrate support pad along a common contact plane defined by the substrate on the at least one passive substrate support pad, a substantially predetermined coefficient of friction, passively determined by and substantially coincident with the substrate coming in contact with the at least one end effector and the at least one predetermined contact area, that is directionally variable so that the predetermined coefficient of friction, on a common portion of the at least one predetermined contact area contacting the common contact plane, has a predetermined passive peak magnitude with respect to different coplanar directions coincident with the common contact plane to provide a directionally deterministic friction force, independently and passively affixing the substrate to the at least one passive substrate support pad along the common contact plane, resulting from a directionally deterministic peak friction coefficient, in at least one predetermined direction of the different coplanar directions than a coefficient of friction in another predetermined direction of the different coplanar directions.

2. The substrate transport apparatus of claim 1, wherein the at least one passive substrate support pad is configured to apply a directional friction force in the plane of the substrate substantially without providing an increased force on the substrate in a direction substantially perpendicular to the plane of the substrate.

3. The substrate transport apparatus of claim 1, wherein the at least one passive substrate support pad forms a monolithic structure with a respective one of the at least one end effector.

4. The substrate transport apparatus of claim 1, wherein the friction forces are directional friction forces where a direction in which the directionally deterministic friction force, from the directionally deterministic peak friction coefficient, of each of the at least one passive substrate support pads acts is dependent on an acceleration vector of the substrate along the plane of the substrate.

5. The substrate transport apparatus of claim 1, wherein each of the at least one passive substrate support pad includes at least one directional friction pad where each directional friction pad includes surface features configured to apply the directionally deterministic friction force, resulting from the directionally deterministic peak friction coefficient, in at least one predetermined direction of the different coplanar directions.

6. The substrate transport apparatus of claim 5, wherein the at least one directional friction pad includes more than one directional friction pad where the at least one predetermined direction of each directional friction pad converges at a common point.

7. The substrate transport apparatus of claim 1, wherein the at least one passive substrate support pad includes more than one substrate support where the at least one predetermined direction of each substrate support pad converge on a common point of a respective one of the at least one end effector.

8. The substrate transport apparatus of claim 1, wherein each of the at least one passive substrate support pad includes one or more of microscopic and nanoscopic structures that provide the friction forces.

9. The substrate transport apparatus of claim 1, wherein the at least one passive substrate support pad is controllable so that an orientation of the at least one substrate support changes from one direction to another direction.

10. The substrate transport apparatus of claim 1, wherein the at least one passive substrate support pad is configured to support a hot wafer.

11. A substrate holding device comprising:
    a drive section; and
    a substrate support connected to the drive section, the substrate support includes at least one passive substrate support pad fixed to the substrate support at a fixed position relative to the substrate support and having a configuration that passively effects, substantially coincident with the substrate coming in contact with the substrate support by coming into contact with at least one predetermined contact area of the at least one passive substrate support pad along a common contact plane defined by the substrate on the at least one passive substrate support pad, a substantially predetermined coefficient of friction, passively determined by and substantially coincident with the substrate coming in contact with the substrate support and the at least one predetermined contact area, that is directionally variable so that the predetermined coefficient of friction, on a common portion of the at least one predetermined contact area contacting the common contact plane, has a predetermined passive peak magnitude with respect to different coplanar directions coincident with the common contact plane to provide a directionally deterministic friction force, independently and passively affixing the substrate to the at least one passive substrate support pad along the common contact plane, resulting from a directionally deterministic peak friction coefficient, in at least one predetermined direction of the different coplanar directions than a coefficient of friction in another predetermined direction of the different coplanar directions.

12. The substrate holding device of claim 11, wherein the drive section is configured to rotate the substrate support about an axis of rotation.

13. The substrate holding device of claim 12, wherein at least one predetermined direction of each of the at least one passive substrate support pad is oriented tangentially relative to rotation of the substrate support.

14. The substrate holding device of claim 12, wherein the substrate holding device includes at least one arm link rotatably coupled to the drive section and the at least one substrate support is rotatably coupled to the at least one arm link.

15. The substrate holding device of claim 11, wherein the at least one passive substrate support pad is configured to apply a directional friction force in the plane of the substrate substantially without providing an increased force on the substrate in a direction substantially perpendicular to the plane of the substrate.

16. The substrate holding device of claim 11, wherein the at least one passive substrate support pad forms a monolithic structure with a respective one of the at least one substrate support.

17. The substrate holding device of claim 11, wherein each of the at least one passive substrate support pad includes at least one directional friction pad where each directional friction pad includes surface features configured to apply the directionally deterministic friction force, resulting from the directionally deterministic peak friction coefficient, in at least one predetermined direction of the different coplanar directions.

18. The substrate holding device of claim 17, wherein the at least one directional friction pad includes more than one directional friction pad where the at least one predetermined direction of each directional friction pad converges at a common point.

19. The substrate holding device of claim 11, wherein the at least one passive substrate support pad includes more than one substrate support pad where the at least one predetermined direction of each substrate support pad converge on a common point of a respective one of the at least one substrate support.

20. The substrate holding device of claim 11, wherein each of the at least one passive substrate support pad includes one or more of microscopic and nanoscopic structures that provide the friction forces.

* * * * *